(12) United States Patent  (10) Patent No.: US 7,030,639 B2
Ueminami et al.  (45) Date of Patent: Apr. 18, 2006

(54) SEMICONDUCTOR APPARATUS INCLUDING A SWITCH ELEMENT AND RESISTANCE ELEMENT CONNECTED IN SERIES

(75) Inventors: Masahiro Ueminami, Kyoto (JP); Hisakazu Kotani, Hyogo (JP); Katsuhiko Shishido, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 70 days.

(21) Appl. No.: 10/776,237

(22) Filed: Feb. 12, 2004

(65) Prior Publication Data

US 2004/0160238 A1 Aug. 19, 2004

(30) Foreign Application Priority Data

Feb. 14, 2003 (JP) ............................ P2003-035901

(51) Int. Cl.
*G01R 31/26* (2006.01)

(52) U.S. Cl. .................. 324/765; 324/763; 324/769
(58) Field of Classification Search ..................... None
See application file for complete search history.

(56) References Cited

U.S. PATENT DOCUMENTS

| 4,215,309 A | | 7/1980 | Frey |
| 4,749,947 A | * | 6/1988 | Gheewala ................... 714/734 |
| 5,818,251 A | * | 10/1998 | Intrater ....................... 324/765 |
| 6,703,682 B1 | * | 3/2004 | Aswell ........................ 257/536 |
| 2001/0025993 A1 | | 10/2001 | Inoue et al. |

FOREIGN PATENT DOCUMENTS

JP 4-152277 5/1992

* cited by examiner

*Primary Examiner*—Minh N. Tang
(74) *Attorney, Agent, or Firm*—McDermott Will & Emery LLP

(57) ABSTRACT

A semiconductor apparatus includes serially-connected bodies composed of a switch element and a resistance element respectively interposed between terminals adjacent to one another, conduction-test terminals connected to one and another ends of a series of the serially-connected bodies, and a switch control terminal for collectively controlling all the plural switch elements. Also included are switch elements interposed alternately on the first semiconductor chip side and the second semiconductor chip side between wires adjacent to one another, conduction-test terminals connected to one and another ends of a series of the serially-connected switch elements, and a switch control terminal for collectively controlling all the plural switch elements.

4 Claims, 14 Drawing Sheets

F I G. 1
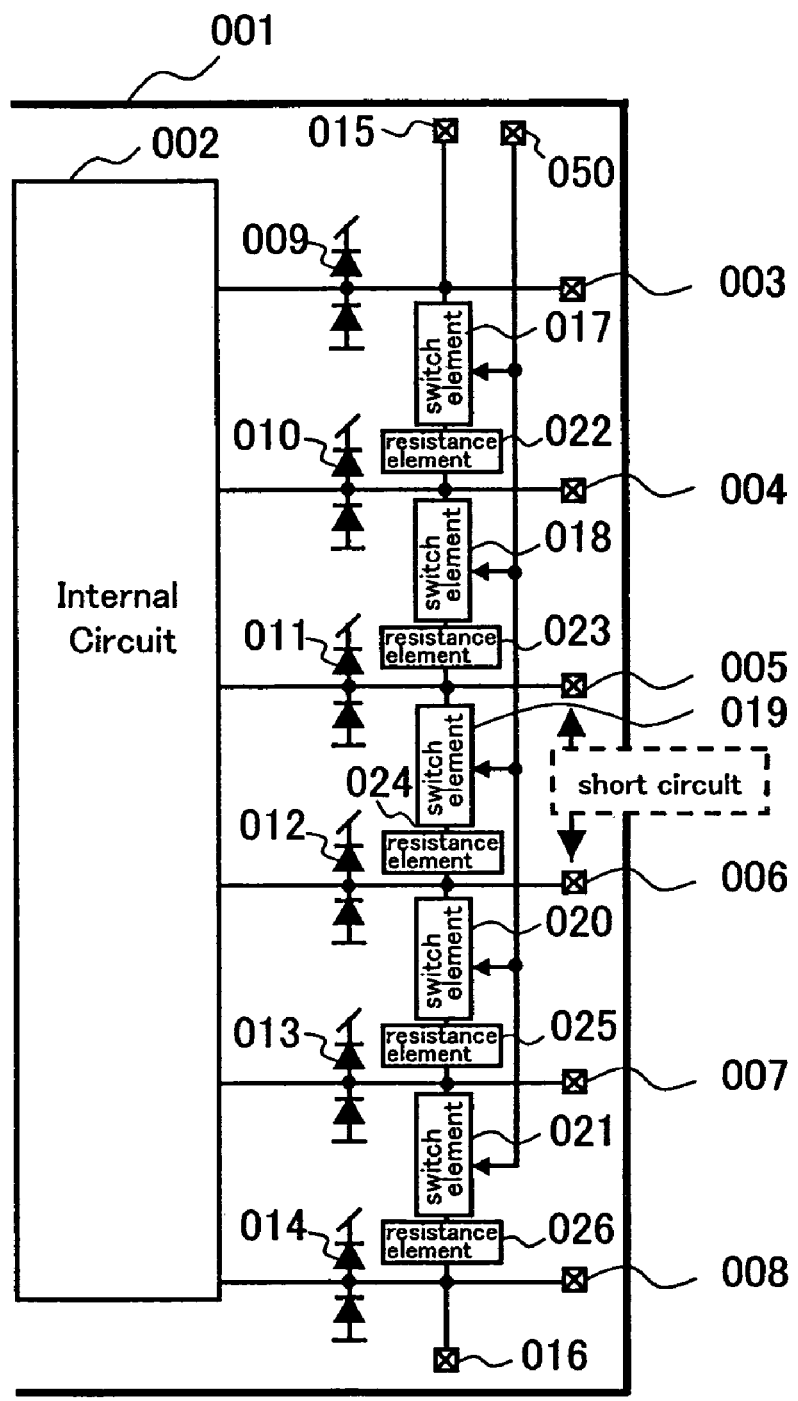

F I G. 6
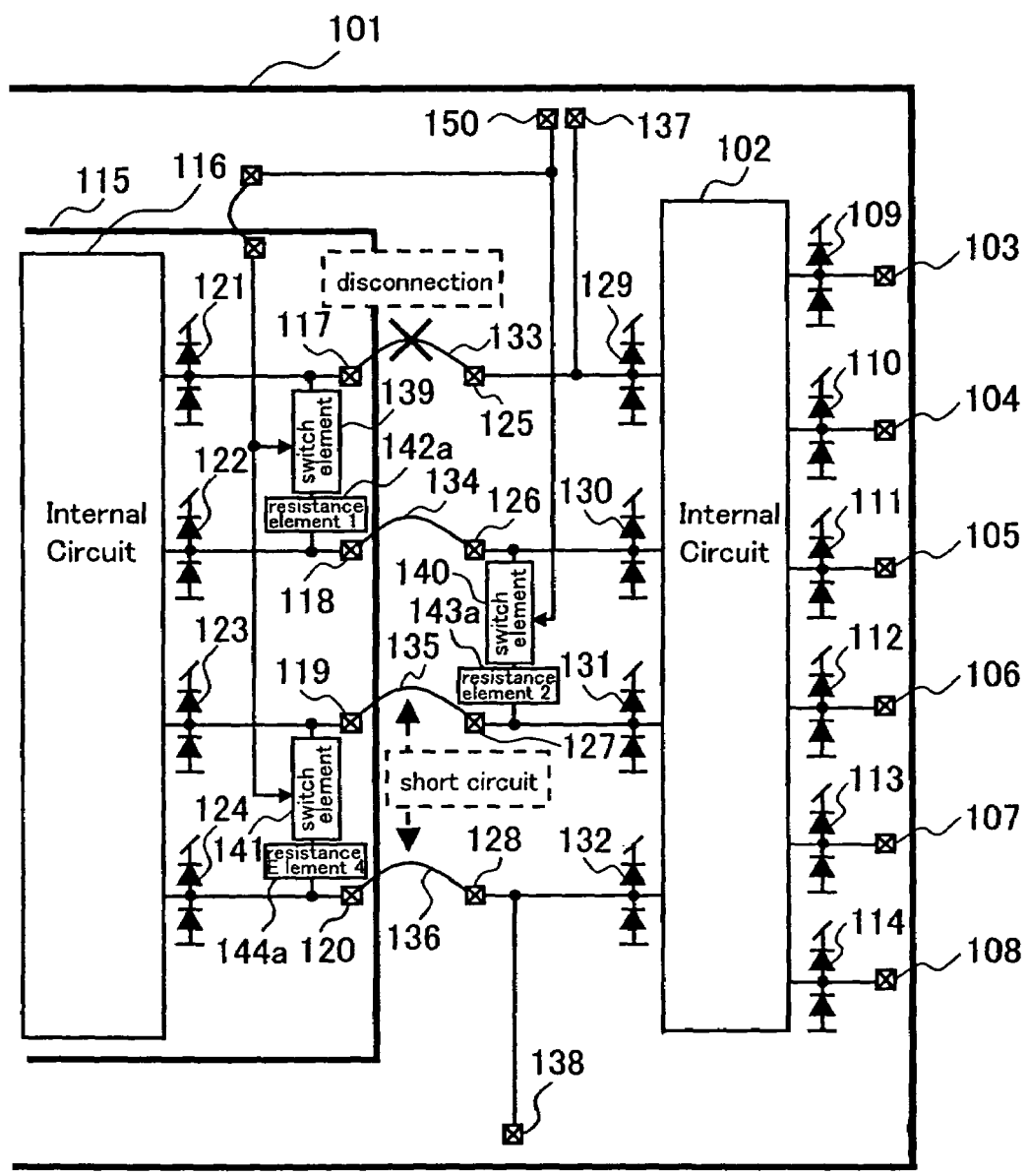

F I G. 1 1
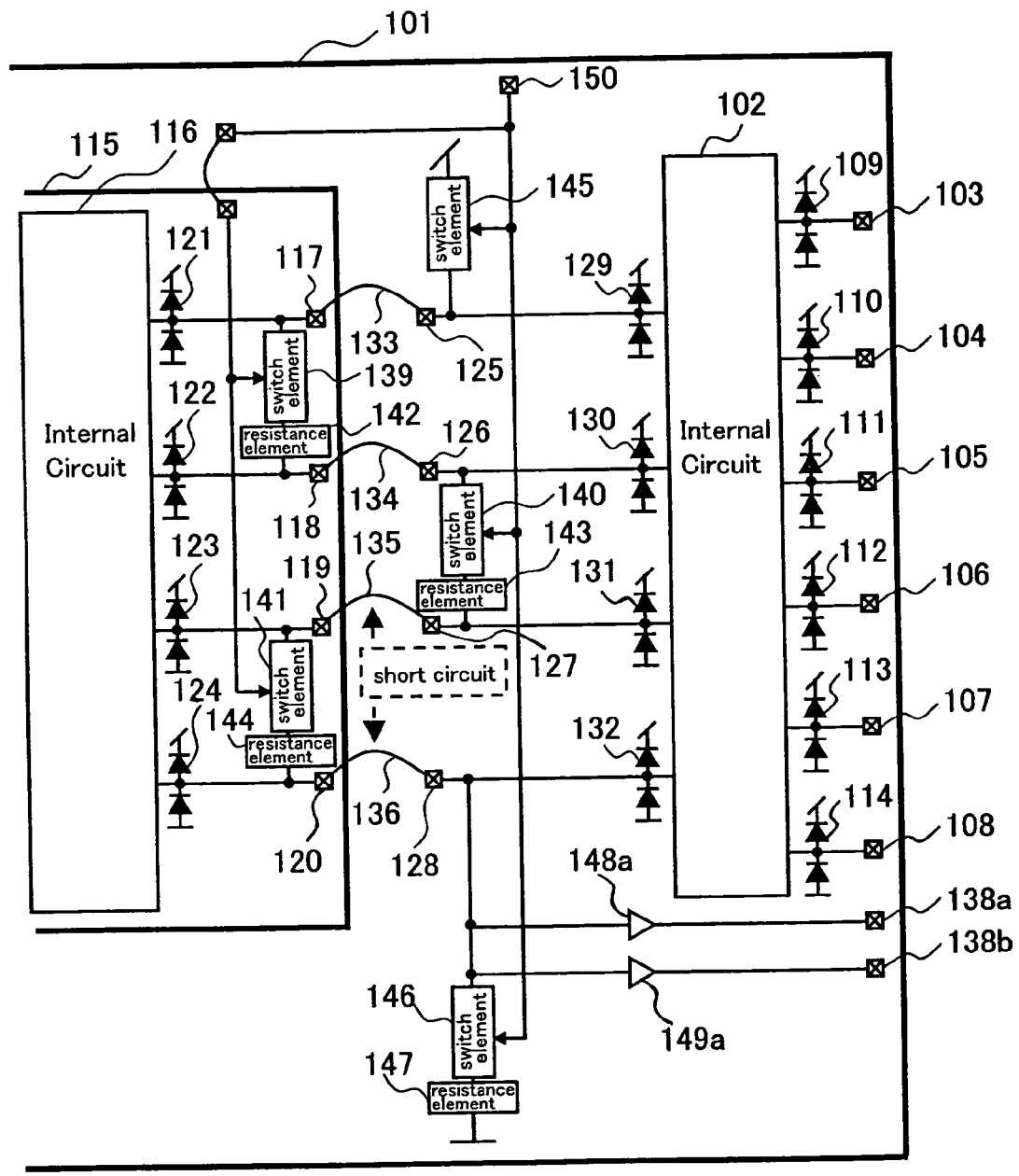

F I G. 1 2
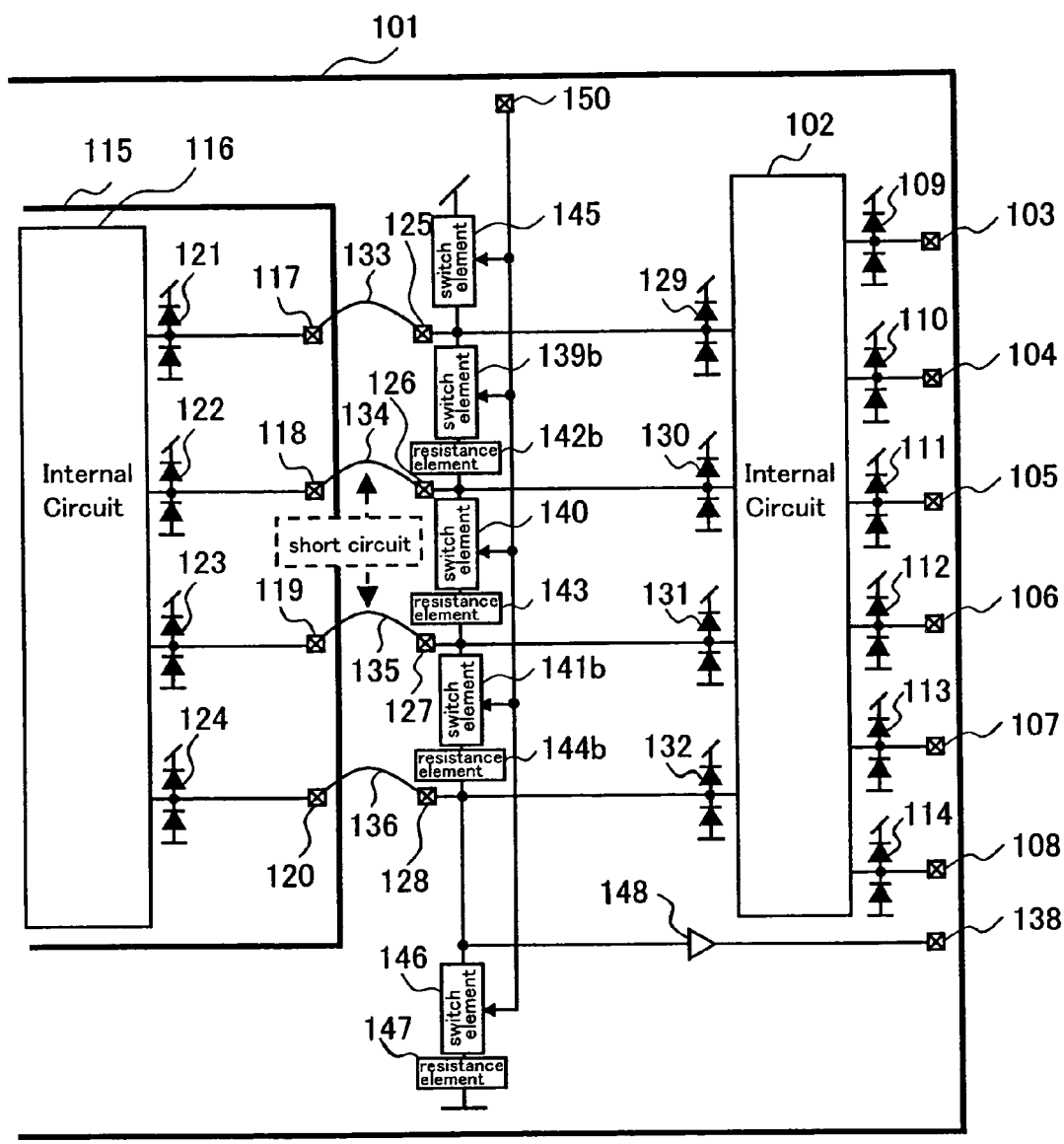

SEMICONDUCTOR APPARATUS INCLUDING A SWITCH ELEMENT AND RESISTANCE ELEMENT CONNECTED IN SERIES

BACKGROUND OF THE INVENTION

This invention relates to a semiconductor apparatus, more particularly to a technology for easily and unfailingly running a conduction test thereof.

In the conduction test of a semiconductor apparatus, it is confirmed, prior to the test, neither disconnection nor short circuit has occurred in respective internal terminals.

In the configuration shown in FIG. 13, a numeral 001 denotes a semiconductor chip, a numeral 002 denotes an internal circuit integrated on the semiconductor chip 001, numerals 003–008 denote terminals for sending and receiving signals between the internal circuit 002 and an external system of the semiconductor chip 001. Numerals 009–014 denote diodes respectively connected to the terminals 003–008 and formed in the forward direction with respect to a power-supply potential (VDD) and in the reverse direction with respect to a ground potential (VSS). To the terminal 003, which is a test object, is applied a potential exceeding <power-supply potential (VDD)+threshold voltage Vt of diode 009>, and to the other terminals 004–008 is applied the ground potential (VSS). At the same time, the flow of a current at the terminal 003 is measured. When the current value is 0, the terminal 003 is not conducted. When an unusually excessive current is detected, there is a short circuit between the terminal 003 and any of the other terminals. These steps are implemented to each of all the terminals in the same manner.

Challenges are that the more increase in the number of the terminals, the longer hours and higher cost are required by the test because the test is to be run for each terminal; and that the test requires a relatively expensive test device capable of measuring a current at the time of applying a voltage.

FIG. 14 shows a configuration of mounting a plurality of semiconductor chips in a package, in which a numeral 101 denotes a parent chip and a numeral 115 denotes a child chip superposed on the parent chip 101. The function of an internal circuit 116 of the child chip 115 is tested via an internal circuit 102 by controlling and observing the terminals 103–108 on the parent chip 101 from outside of the package. In doing so, a conduction test is indirectly run to chip-connecting terminals 117–120 and 125–128 and wires 133–136. The problem in that is there arises the necessity to take into account how the chip-connecting terminals should be combined in order to run the test to detect all of possible disconnections and short circuits therein, which requires a great deal of ingenuity in creating a test pattern to be supplied to the parent chip.

SUMMARY OF THE INVENTION

Therefore, a main object of the present invention is to provide a semiconductor apparatus capable of collectively and reliably running a conduction test to all terminals instead of testing each terminal to thereby largely reduce time required by a conduction test, and further a semiconductor apparatus capable of directly, instead of indirectly, running the conduction test to chip-connecting terminals in the case of mounting a plurality of semiconductor chips in a package.

Other objects, aspects and advantages of the present invention will become apparent from the following description of the invention.

In order to solve the previously described problems, the present invention implements the following measures.

A semiconductor apparatus according to the present invention comprises:

serially-connected bodies comprised of a switch element and a resistance element respectively interposed between a plurality of terminals adjacent to one another;

terminals for a conduction test respectively connected to one and another ends of a series of the serially-connected bodies; and a switch-control terminal for collectively controlling all the plural switch elements.

There are provided a plurality of terminals. The serially-connected bodies are each comprised of the switch and resistance elements serially connected to each other. The serially-connected bodies are interposed between the terminals adjacent to one another, as a principle, between all the adjacent terminals. The interposed plural connected bodies are serially connected to one another, which constitute a series of the serially-connected bodies, as previously mentioned. One and another ends of a series of the serially-connected bodies are provided with conduction-test terminals connected thereto for applying a voltage in the conduction test. There is also provided the switch control terminal for controlling on/off of the switch elements of the respective serially-connected bodies. All the switch elements are collectively controlled by the switch control terminal.

The action of the foregoing configuration is described. All the switch elements are conducted in the conduction test, and a potential difference is applied between the conduction-test terminals provided on both ends of the serially-connected bodies. Then, a current value flowing between the conduction-test terminals is measured. When all the terminals are in normal state with no malfunction, a value of the current flow is:

[potential difference/Total resistance value of all the resistance elements]

However, when a short circuit occurs between the adjacent terminals, the resistance element connected to both ends of the short-circuited terminals is circumvented, which results in measuring an increased current value. A difference in the current values enables a short circuit between the adjacent terminals to be detected.

More specifically, it is unnecessary to test each of the plural terminals because the plural terminals are collectively examined for the detection of short circuits, which results in a large reduction in time required by the conduction test consequently leading to a reduced test cost.

In a semiconductor apparatus according to the present invention, further includes that each resistance value of the plural resistance elements in the plural serially-connected bodies is weighted. The purpose of this is to distinguish the plural resistance elements in terms of which terminals they are interposed between.

When the resistance values of the plural resistance elements are equal to one another, the measured current value, though increased due to a short circuit, is the same regardless of where the short circuit occurs. In contrast to that, when the resistance values are weighted, the measured current value shows a unique certain value depending on where the short circuit occurs. In other words, the measured current value changes depending on where the short circuit occurs. This allows not only the occurrence of the short circuit but also the location thereof to be determined.

A semiconductor apparatus according to the present invention comprises:

serially-connected bodies comprised of a switch element and a resistance element respectively interposed between a plurality of terminals adjacent to one another;

switch elements on power-supply and ground potential sides for respectively connecting one and another ends of a series of the serially-connected bodies to the power-supply potential;

a switch control terminal for collectively controlling all the plural switch elements;

a resistance element for dividing voltage serially connected to a group of the resistance elements in a series of the serially-connected bodies in order to divide voltage;

a logic element for detecting a potential variation at a point of dividing voltage between the resistance elements of a series of the serially-connected bodies and the voltage-dividing resistance element; and a terminal for a conduction test connected to an output side of the logic element.

The action of the foregoing configuration is described. All the switch elements are conducted in the conduction test, and an output potential of the logic element is measured. When all the terminals are in normal state with no malfunction, a potential voltage-divided between the resistance elements of a series of the serially-connected bodies and the voltage-dividing resistance element stays within a predetermined range, and the logic element outputs a predetermined value. Meanwhile, when a short circuit occurs between the adjacent terminals, the resistance element connected between the short-circuited terminals is circumvented. Therefore, the voltage-divided potential goes beyond the predetermined range and the logic element outputs a value reverse to the same in normal state. To put it differently, the presence or absence of a short circuit between the adjacent terminals can be detected according to the output value of the logic element. The potential variation at the voltage-dividing point can be detected by comparing ups and downs of the potential at the voltage-dividing point to a threshold value of the logic element. The reversed output value of the logic element enables the plural terminals to be collectively examined for the detection of short circuits. This results in a large reduction in time required by the conduction test to consequently achieve a reduced test cost. Furthermore, the conduction test only requires the measurement of the voltage level. Therefore, it is unnecessary to provide a relatively expensive test device capable of measuring a current at the time of applying a voltage, which successfully simplifies a test device used.

The followings refer to a semiconductor apparatus given that it includes the configuration of parent and child chips.

A semiconductor apparatus according to the present invention, wherein first and second semiconductor chips respectively having a plurality of chip-connecting terminals are mounted in a package, and the respective chip-connecting terminals of the first and the second semiconductor chips are connected to each other via wires, comprises:

switch elements interposed alternately on the first semiconductor chip side and the second semiconductor chip side between the plural wires adjacent to one another;

terminals for a conduction test respectively connected to one and another ends of a series of the serially-connected switch elements; and a switch control terminal for collectively controlling all the plural switch elements.

The first and the second semiconductor chips may be respectively referred to as a parent chip and a child chip. The plural switch elements are serially connected in succession, in which the adjacent switch elements are disposed alternately on the first semiconductor chip side and the second semiconductor chip side, which constitutes, more specifically, a series of serially-connected bodies arranged as, wire—switch element—wire—switch element . . . .

The reason for the present invention to include the resistance elements in the respective serially-connected bodies is that there would be an excessive current flow without the resistance elements. Therefore, the resistance elements are necessarily provided in the solution to avoid such an excessive current flow. However, in the configuration that chip-connecting terminals are connected to each other via wires, the wires work as resistance elements and there is no particular need for providing resistance elements. Still, the possibility of interposing the resistance elements is not eliminated as circumstances demand.

The action of the foregoing configuration is described. All the switch elements are conducted in the conduction test, and a potential difference is applied between the conduction-test terminals provided on both ends of the serially-connected bodies. Then, a current value flowing between the conduction-test terminals is measured. When all the chip-connecting terminals are in normal state with no malfunction, there flows a current between the conduction-test terminals. However, in the presence of a disconnection in any of the wires connecting the respective chip-connecting terminals of the first and the second semiconductor chips, high-impedance occurs between the conduction-test terminals leading the measured current value to zero. Thus, the presence or absence of a disconnection can be detected according to the measured current value. More specifically, the wires connecting the chip-connecting terminals can be collectively examined for the detection of disconnections.

In a semiconductor apparatus according to the present invention, further includes that resistance elements are serially connected to the respective plural switch elements.

The action of the foregoing configuration is described. All the switch elements are conducted in the conduction test, and a potential difference is applied between the conduction-test terminals provided on both ends of the serially-connected bodies. Then, a current value flowing between the conduction-test terminals is measured. When all the chip-connecting terminals are in normal state with no malfunction, a value of the current flow is:

[potential difference/Total resistance value of all the resistance elements]

However, when a disconnection occurs in any of the wires connecting the respective chip-connecting terminals of the first and the second semiconductor chips, the measured current value is zero because of the high impedance between the conduction-test terminals. Thus, the presence or absence of a disconnection can be detected according to the measured current value. Further, when a short circuit occurs between the adjacent chip-connecting terminals, the resistance element connected to both ends of the short-circuited terminals is circumvented, which results in measuring an increased current value. A difference in the current values enables a short circuit between the adjacent chip-connecting terminals to be detected. A short circuit still generates a difference in the current value in the absence of the resistance elements, however the change is very small. The resistance elements are used to unfailingly detect a short circuit by increasing the difference in the current value.

As described, in addition to that the wires connecting the chip-connecting terminals can be collectively examined for the detection of disconnections, it is advantageous that the chip-connecting terminals can be collectively examined for the detection of short circuits by confirming the difference in the current value.

In a semiconductor apparatus according to the present invention, further includes that each resistance value of the plural resistance elements is weighted. In this manner, the measured current value shows a unique certain value depending on where a short circuit occurs, which enables the short circuit in the chip-connecting terminals to be located.

A semiconductor apparatus according to the present invention, wherein first and second semiconductor chips respectively having a plurality of chip-connecting terminals are mounted in a package, and the respective chip-connecting terminals of the first and the second semiconductor chips are connected to each other via wires, comprises:

on the first semiconductor chip side, serially-connected bodies each comprised of a switch element and a resistance element respectively interposed between the plural chip-connecting terminals adjacent to one another;

terminals for a conduction test respectively connected to one and another ends of a series of the serially-connected bodies; and a switch control terminal for collectively controlling all the plural switch elements.

This configuration corresponds to a plurality of serially-connected bodies each comprised of a switch element and a resistance element in the fifth solution entirely transferred to the first semiconductor chip side.

The action of the foregoing configuration is described. Apart from the detection of any disconnection between the respective chip-connecting terminals of the first and the second semiconductor chips, when the short circuit occurs between the adjacent chip-connecting terminals on the first semiconductor chip side, a short circuit can be detected according to an increase in a measured current value. Furthermore, having the included components integrated on the first semiconductor chip side, it is totally unnecessary to change the design of the second semiconductor chip, for example, adding switch and resistance elements for the conduction test thereto. In this case, it is possible to use any of the conventional semiconductor chips, for example, manufactured by other companies, for the second semiconductor chip.

A semiconductor apparatus according to the present invention, wherein first and second semiconductor chips respectively having a plurality of chip-connecting terminals are mounted in a package, and the respective chip-connecting terminals of the first and the second semiconductor chips are connected to each other via wires, comprises:

on the first semiconductor chip side, switch elements interposed between the respective plural chip-connecting terminals and a terminal for a conduction test;

a switch control device for selectively controlling on/off of the plural switch elements;

on the second semiconductor chip side, diodes connected to the plural chip-connecting terminals in the forward direction with respect to a power-supply potential and in the reverse direction with respect to a ground potential; on the first semiconductor chip side, line switch elements interposed in lines of the plural chip-connecting terminals; and a terminal for a conduction test connected to an on/off control terminal of the line switch elements.

The action of the foregoing configuration is described. The line switch elements are turned off by controlling the conduction-test terminal in the conduction test to thereby block the conduction-test terminal with respect to the first semiconductor chip. Then, only one switch element is conducted by the switch control device to thereby apply a potential exceeding [power-supply potential (VDD)+threshold voltage Vt of diode] to the conduction-test terminal and measure a value of the current flow. The current flows when the corresponding chip-connecting terminals are in normal state with no malfunction. When there is a disconnection in any of the wires connecting the respective chip-connecting terminals of the first and the second semiconductor chips, the measured current value is zero because of high impedance between the respective chip-connecting terminals. By performing the described measurement sequentially to all the chip-connecting terminals, the presence or absence of a disconnection in each of the wires connecting the chip-connecting terminals is detected. Moreover, having the included components integrated on the first semiconductor chip side, it is totally unnecessary to change the design of the second semiconductor chip, for example, adding switch and resistance elements for the conduction test thereto. In this case, it is possible to use any of the conventional semiconductor chips, for example, manufactured by other companies for the second semiconductor chip.

Here is described the case in which the switch elements comprises a N-type MOS transistor. In such a case, though a potential applied to the terminals targeted for measuring a current in a conduction test is set at [power-supply potential (VDD)+threshold voltage Vt of diode], it is not possible to propagate a potential equal to VDD or more because a gate potential of the N-type MOS transistor equals VDD. This results in a failure to obtain a potential difference required for flowing a forward current through to both ends of diodes.

Given this factor, a power-supply potential (VDD1) to be supplied to a first semiconductor chip and a power-supply potential (VDD2) to be supplied to a second semiconductor chip are separately supplied thereto so that VDD1>VDD2 is drawn. Then, it becomes unnecessary to apply a potential exceeding the VDD1 to the terminals targeted for measuring a current in the conduction test. More specifically, when a potential equal to VDD1 is applied, a forward current can flow through to the diodes. Thus, the conduction test can be successfully implemented.

Here is described the case in which the switch elements comprises a P-type MOS transistor. In such a case, though a potential applied to the terminals targeted for measuring a current in a conduction test is set at [power-supply potential (VDD)+threshold voltage Vt of diode], it is not possible to propagate a potential equal to VDD or more because a gate potential of the P-type MOS transistor equals VDD. This results in a failure to obtain a potential difference required for flowing a forward current through to both ends of diodes.

Given this factor, a ground potential (VSS1) to be supplied to a first semiconductor chip and a ground potential (VSS2) to be supplied to a second semiconductor chip are separately supplied there to so that VSS1<VSS2 is drawn. Then, it becomes unnecessary to apply a potential below the VSS1 to the terminals targeted for measuring a current in the conduction test. More specifically, when a potential equal to VSS1 is applied, a forward current can flow through to the diodes. Thus, the conduction test can be successfully implemented.

A semiconductor apparatus according to the present invention, wherein first and second semiconductor chips respectively having a plurality of chip-connecting terminals are mounted in a package, and the respective chip-connecting terminals of the first and the second semiconductor chips are connected to each other via wires, comprises:

serially-connected bodies each comprised of a switch element and a resistance element interposed alternately on the first semiconductor chip side and the second semiconductor chip side between the plural wires adjacent to one another;

a switch element on a power-supply potential side for connecting one end of a series of the serially-connected bodies to the power-supply potential;

a switch element on a ground potential side for connecting another end of a series of the serially-connected bodies to the ground potential;

a switch control terminal for collectively controlling all the plural switch elements;

a resistance element for dividing voltage serially connected to a group of the resistance elements in a series of the serially-connected bodies in order to divide voltage;

a logic element for detecting that a potential at a point of dividing voltage between the resistance elements of a series of the serially-connected bodies and the voltage-dividing resistance element exceeds a predetermined value; and a terminal for a conduction test connected to an output side of the logic element.

The foregoing configuration constitutes a series of the serially-connected bodies arranged as, wire—(switch element+resistance element)—wire—(switch element+resistance element) . . . .

The action of the foregoing configuration is described. All the switch elements are conducted in the conduction test, and an output potential of the logic element is measured. When all the chip-connecting terminals are in normal state with no malfunction, a potential voltage-divided between the resistance elements of a series of the serially-connected bodies and the voltage-dividing resistance element stays within a predetermined range, and the logic element thus outputs a predetermined value. On the contrary, when a short circuit occurs between the adjacent chip-connecting terminals, the resistance element connecting the short-circuited terminals is circumvented. Therefore, the voltage-divided potential goes beyond the predetermined range, and the logic element outputs a value reverse to the same in normal state. More specifically, the adjacent chip-connecting terminals can be collectively examined for the detection of short circuits according to the output value of the logic element. Furthermore, the conduction test only requires the measurement of the voltage level. Therefore, it is unnecessary to provide a relatively expensive test device capable of measuring a current at the time of applying a voltage, which successfully simplifies a test device used.

A semiconductor apparatus according to the present invention, wherein first and second semiconductor chips respectively having a plurality of chip-connecting terminals are mounted in a package, and the respective chip-connecting terminals of the first and the second semiconductor chips are connected to each other via wires, comprises:

serially-connected bodies each comprised of a switch element and a resistance element interposed alternately on the first semiconductor chip side and the second semiconductor chip side between the plural wires adjacent to one another;

a switch element on a power-supply potential side for connecting one end of a series of the serially-connected bodies to the power-supply potential;

a switch element on a ground potential side for connecting another end of a series of the serially-connected bodies to the ground potential;

a switch control terminal for collectively controlling all the plural switch elements;

a resistance element for dividing voltage serially connected to a group of the resistance elements in a series of the serially-connected bodies in order to divide voltage;

a logic element for detecting that a potential at a point of dividing voltage between the resistance elements of a series of the serially-connected bodies and the voltage-dividing resistance element falls below a predetermined value; and a terminal for a conduction test connected to an output side of the logic element.

A difference between the above configuration and this configuration is that the voltage-divided potential exceeds or falls below the predetermined value.

The action of the foregoing configuration is described. When a disconnection occurs in any of the wires connecting the respective chip-connecting terminals of the first and the second semiconductor chips, the voltage-divided potential goes beyond the predetermined range, and the logic element outputs a value reverse to the same in normal state. To put it differently, the presence or absence of a disconnection is detected according to the output value of the logic element. Furthermore, the conduction test only requires the measurement of the voltage level. Therefore, it is unnecessary to provide a relatively expensive test device capable of measuring a current at the time of applying a voltage, which successfully simplifies a test device used.

A semiconductor apparatus according to the present invention, wherein first and second semiconductor chips respectively having a plurality of chip-connecting terminals are mounted in a package, and the respective chip-connecting terminals of the first and the second semiconductor chips are connected to each other via wires, comprises:

serially-connected bodies comprised of a switch element and a resistance element interposed alternately on the first semiconductor chip side and the second semiconductor chip side between the plural wires adjacent to one another;

a switch element on a power-supply potential side for connecting one end of a series of the serially-connected bodies to the power-supply potential;

a switch element on a ground potential side for connecting another end of a series of the serially-connected bodies to the ground potential;

a switch control terminal for collectively controlling all the plural switch elements;

a resistance element for dividing voltage serially connected to a group of the resistance elements in a series of the serially-connected bodies in order to divide voltage;

a first logic element for detecting that a potential at a point of dividing voltage between the resistance elements of a series of the serially-connected bodies and the voltage-dividing resistance element exceeds a predetermined value; and a second logic element for detecting that a potential at a point of dividing voltage between the resistance elements of a series of the serially-connected bodies and the voltage-dividing resistance element falls below a predetermined value; and terminals for a conduction test connected to output sides of the first and the second logic elements.

The action of the foregoing configuration is described. All the switch elements are conducted in the conduction test, and the output potentials of the first and the second logic elements are measured. When all the chip-connecting terminals are in normal state with no malfunction, a potential voltage-divided between the resistance elements of a series of the serially-connected bodies and the voltage-dividing resistance element stays within a predetermined range, and the logic elements respectively output predetermined values. Meanwhile, when a short circuit occurs between the adjacent terminals, the resistance element connecting the short-circuited terminals is circumvented. Therefore, the voltage-divided potential goes beyond the predetermined range and the first logic element outputs a value reverse to the same in normal state. To put it differently, the presence or absence of a short circuit between the adjacent chip-connecting terminals can be detected according to the reversed output value of the first logic element. When a disconnection occurs in any of the wires connecting the respective chip-connecting terminals of the first and the second semiconductor chips, the voltage-divided potential goes beyond the predetermined range, and the second logic element outputs a value reverse to the same in normal state, that is to say the presence or absence of a disconnection can be detected according to the reversed output value of the second logic element. On the whole, both short circuits and disconnections can be detected.

A semiconductor apparatus according to the present invention, wherein first and second semiconductor chips respectively having a plurality of chip-connecting terminals are mounted in a package, and the respective chip-connecting terminals of the first and the second semiconductor chips are connected to each other via wires, comprises:

on the first semiconductor chip side, serially-connected bodies each comprised of a switch element and a resistance element respectively interposed between a plurality of terminals adjacent to one another;

a switch element on a power-supply potential side for connecting one end of a series of the serially-connected bodies to the power-supply potential;

a switch element on a ground potential side for connecting another end of a series of the serially-connected bodies to the ground potential;

a switch control terminal for collectively controlling all the plural switch elements;

a resistance element for dividing voltage serially connected to a group of the resistance elements in a series of the serially-connected bodies in order to divide voltage;

a logic element for detecting a potential variation at a point of dividing voltage between the resistance elements of a series of the serially-connected bodies and the voltage-dividing resistance element; and a terminal for a conduction test connected to an output side of the logic element.

The action of the foregoing configuration is described. All the switch elements are conducted in the conduction test to thereby, and an output potential of the logic element is measured. When all the terminals are in normal state with no malfunction, a potential voltage-divided between the resistance elements of a series of the serially-connected bodies and the voltage-dividing resistance element stays within a predetermined range, and the logic element outputs a predetermined value. Meanwhile, when a short circuit occurs between the adjacent chip-connecting terminals, the resistance element connected to the short-circuited chip-connecting terminals is circumvented. Therefore, the voltage-divided potential goes beyond the predetermined range, and the logic element outputs a value reverse to the same in normal state. To put it differently, the presence or absence of a short circuit between the adjacent chip-connecting terminals can be detected according to the output value of the logic element. In examining collectively the chip-connecting terminals for the detection of short circuits, the conduction test only requires the measurement of the voltage level. Therefore, it is unnecessary to provide a relatively expensive test device capable of measuring a current at the time of applying a voltage, which successfully simplifies a test device used. Furthermore, having the included components integrated on the first semiconductor chip side, it is totally unnecessary to change the design of the second semiconductor chip, for example, adding switch and resistance elements for the conduction test thereto. In this case, it is possible to use a conventional semiconductor chip, for example, manufactured by other companies for the second semiconductor chip.

In the present invention, the switch elements or resistance elements can be formed from N-type or P-type MOS transistors, or N-type and P-type MOS transistors to thereby achieve a more simplified configuration.

The foregoing and other aspects will become apparent from the following description of the invention when considered in conjunction with the accompanying drawing figures.

BRIEF DESCRIPTION OF THE DRAWINGS

These and other objects as well as advantages of the invention will become clear by the following description of preferred embodiments of the invention with reference to the accompanying drawings, wherein:

FIG. 1 is a block circuit diagram showing the configuration of a semiconductor apparatus according to an Embodiment 1 of the present invention;

FIG. 6 is a block circuit diagram showing the configuration of a semiconductor apparatus according to an Embodiment 6 of the present invention;

FIG. 11 is a block circuit diagram showing the configuration of a semiconductor apparatus according to an Embodiment 11 of the present invention;

FIG. 12 is a block circuit diagram showing the configuration of a semiconductor apparatus according to an Embodiment 12 of the present invention;

In all these figures, like components are indicated by the same numerals

DETAILED DESCRIPTION

DESCRIPTION OF THE PREFERRED EMBODIMENTS

Figure 2:
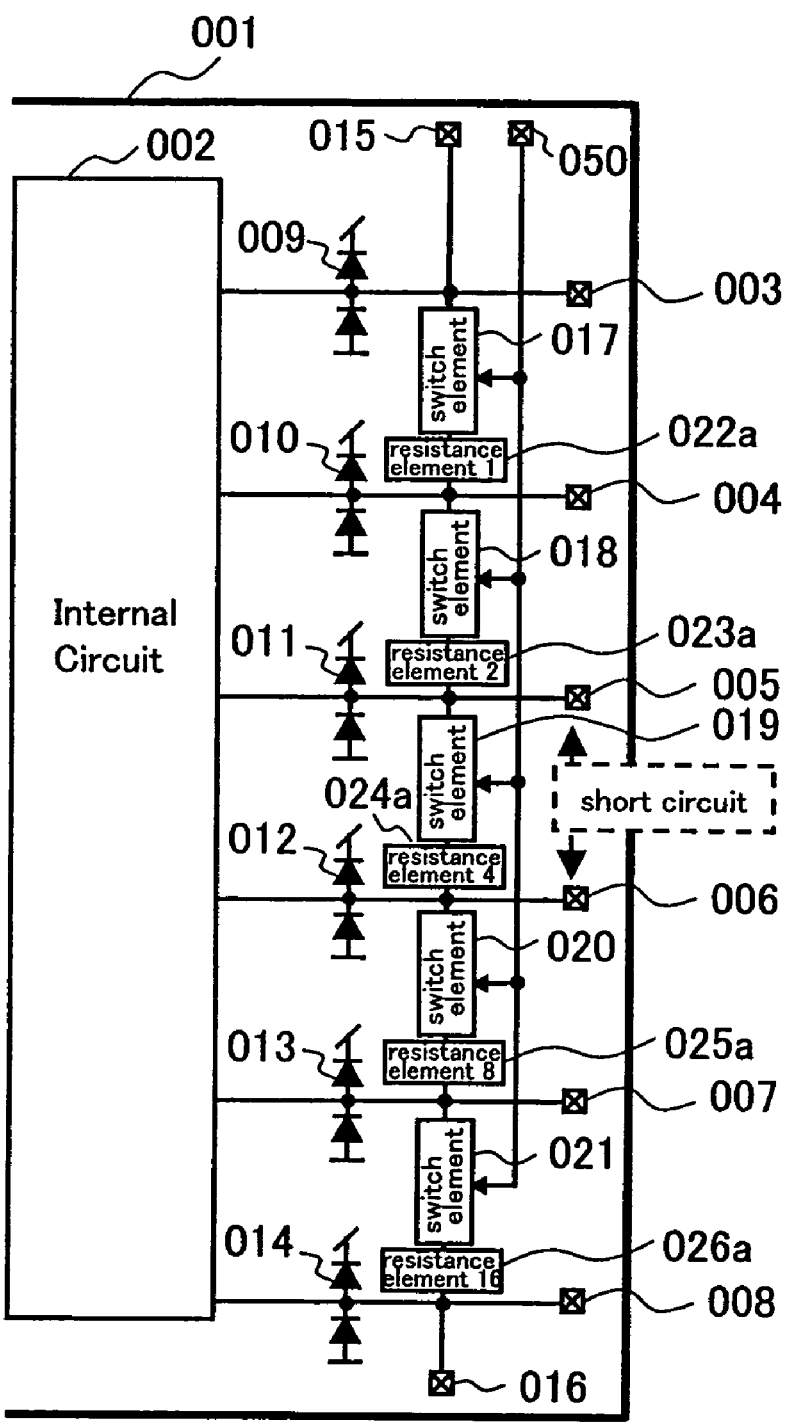
FIG. 2 is a block circuit diagram showing the configuration of a semiconductor apparatus according to an Embodiment 2 of the present invention.

Hereinafter are described preferred embodiments of a semiconductor apparatus according to the present invention referring to the drawings.

Embodiment 1

FIG. 1 is a block circuit diagram showing the configuration of a semiconductor apparatus according to an Embodiment 1 of the present invention. In FIG. 1, a numeral 001 denotes a semiconductor chip, a numeral 002 denotes an internal circuit integrated on the semiconductor chip 001, numerals 003–008 denote terminals for sending and receiving signals between the internal circuit 002 and an external system of the semiconductor chip 001. Numerals 009–014 denote diodes respectively connected to the terminals 003–008 and formed in the forward direction with respect to a power-supply potential (VDD) and in the reverse direction with respect to a ground potential (VSS). Numerals 015 and 016 denote terminals for a conduction test and a numeral 050 denotes a switch control terminal, which are used for running a conduction test collectively to the terminals 003–008. Numerals 017–021 and 022–026 respectively denote switch elements and resistance elements serially connected between the terminals 003–008. The switch elements 017–021 are conducted when the power-supply potential is applied to the switch control terminal 050 and non-conducted when the ground potential (VSS) is applied thereto. A switch element and a resistance element are serially connected to form a serially-connected body. A plurality of the serially-connected bodies are collectively referred to as a series of the serially-connected bodies.

The action of the semiconductor apparatus according to this embodiment configured in the foregoing manner is hereinafter described.

When the power-supply potential (VDD) is applied to the conduction-test terminal 015 and the switch control terminal 050 and the ground potential (VSS) is applied to the conduction-test terminal 016, the switch elements 017–021 are conducted.

When the terminals 003–008 are in normal state with no malfunction, a current flowing between the VDD-applied conduction-test terminal 015 and the VSS-applied conduction-test terminal 016 is:

[VDD–VSS/Total resistance value of resistance elements 022–026]

However, when a short circuit occurs, for example, between the terminal 005 and 006, the current is:

[VDD–VSS/Total resistance value of resistance elements 022, 023, 025 and 026]

According to this embodiment, it is unnecessary to test each of the plural terminals because the plural terminals can be collectively examined for the detection of short circuits. Therefore, time required by the conduction test can be largely reduced achieving a reduced test cost.

Embodiment 2

FIG. 2 is a block circuit diagram showing the configuration of a semiconductor apparatus according to an Embodiment 2 of the present invention. In FIG. 2, the reference numerals shown therein identical to those in FIG. 1 of the Embodiment 1 refer to the same components. Therefore, the detailed descriptions thereof are omitted. The Embodiment 2 differs from the Embodiment 1 in resistance elements 022a–026a, resistance values of which are weighted twice relative to one another.

The action of the semiconductor apparatus of this embodiment configured in the foregoing manner is hereinafter described. The basic action is the same as described in the Embodiment 1. The plural terminals can be collectively examined for the detection of short circuits in one measurement. Furthermore, the resistance values of the resistance elements 022a–026a are twice as different relative to one another, the measured current value shows a unique certain value depending on where the short circuit occurs. In this manner, the occurrence of the short circuit can be located.

The resistance values of the plural resistance elements are not necessarily weighted twice relative one another. The weighting may done, supposing that is an optional real number, k times. It is even unnecessary for the weighting to be so orderly as multiplying, for example, k times relative to one another. The resistance values of the plural resistance elements are only required to be different to one another.

Embodiment 3

Figure 3:
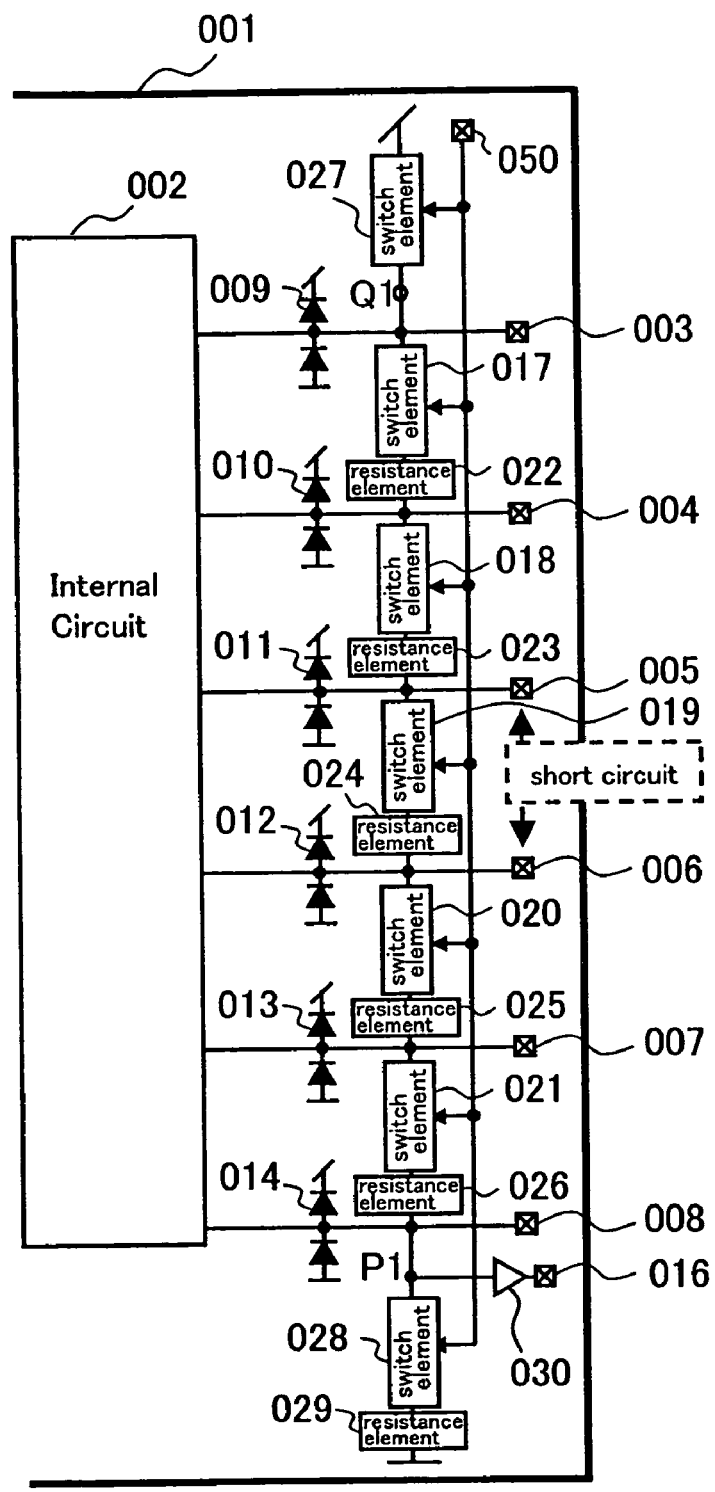
FIG. 3 is a block circuit diagram showing the configuration of a semiconductor apparatus according to an Embodiment 3 of the present invention.

FIG. 3 is a block circuit diagram showing the configuration of a semiconductor apparatus according to an Embodiment 3 of the present invention. In FIG. 3, the reference numerals shown therein identical to those in FIG. 1 of the Embodiment 1 refer to the same components. Therefore, the detailed descriptions thereof are omitted. The Embodiment 3 differs from the Embodiment 1 in a switch element 027 on a power-supply potential side, a switch element 028, a resistance element for dividing voltage 029 and a logic element 030 on a ground potential side. The switch element 027 on the power-supply potential side is connected between a terminal 003 and the power-supply potential (VDD). A serially-connected body comprised of the switch element 028 and the voltage-dividing resistance element 029 on the ground potential side is connected between a terminal 008 and the ground potential (VSS). The switch element 027 on the power-supply potential side and the switch element 028 on the ground potential side are, in the same manner as the switch elements 017–021, are conducted when the power-supply potential (VDD) is applied to a switch control terminal 050, and non-conducted when the ground potential (VSS) is applied thereto. The logic element 030 is interposed between a conduction-test terminal 016 and the switch element 028 on the ground potential side. A potential voltage-divided by a total resistance value of resistance elements 022–026 serially connected between an input portion of the logic element 030 and the power-supply potential (VDD) and a resistance value of the voltage-dividing resistance element 029 serially connected between an input portion of the logic element 030 and the ground potential (VSS) is set to be lower than an input threshold level of the logic element 030.

The action of the semiconductor apparatus of this embodiment configured in the foregoing manner is hereinafter described. The basic action is the same as described in the Embodiment 1, that is the plural terminals can be collectively examined for the detection of short circuits in one measurement. Furthermore, the power-supply potential (VDD) is applied to the switch control terminal 050, the switch elements 017–021, 027 and 028 are conducted. When the terminals 003–008 are in normal state with no malfunction, because the voltage-divided potential is below the threshold value of the logic element 030, the logic element 030 outputs a predetermined value. Meanwhile, for example, when a short circuit occurs between the terminals 005–006, the resistance element 024 connected between the terminals 005–006 is circumvented. Therefore, the voltage-divided potential is higher than the threshold value of the logic element 030, and the logic element 030 outputs a value reverse to the foregoing value in normal state. Thus, the plural terminals can be collectively examined for the detection of short circuits according to an output value of the logic element 030 in one measurement. Accordingly, time required by the conduction test can be largely reduced achieving a reduced test cost. Further, it is unnecessary to provide a relatively expensive test device capable of measuring a current at the time of applying a voltage, which successfully simplifies a test device used.

The logic element 030, instead of being connected to a point P1, may be connected between the switch element 028 and the voltage-dividing resistance element 029. As another possible arrangement, the voltage-dividing resistance element 029, instead of being connected to the switch element 028 on the ground potential side, is serially connected to the switch element 027 on the power-supply potential side between the power-supply potential (VDD) and a point Q1, and then the logic element and conduction-test terminal are connected to the point Q1. This modification may be applied to embodiments that follow.

Embodiment 4

Figure 4:
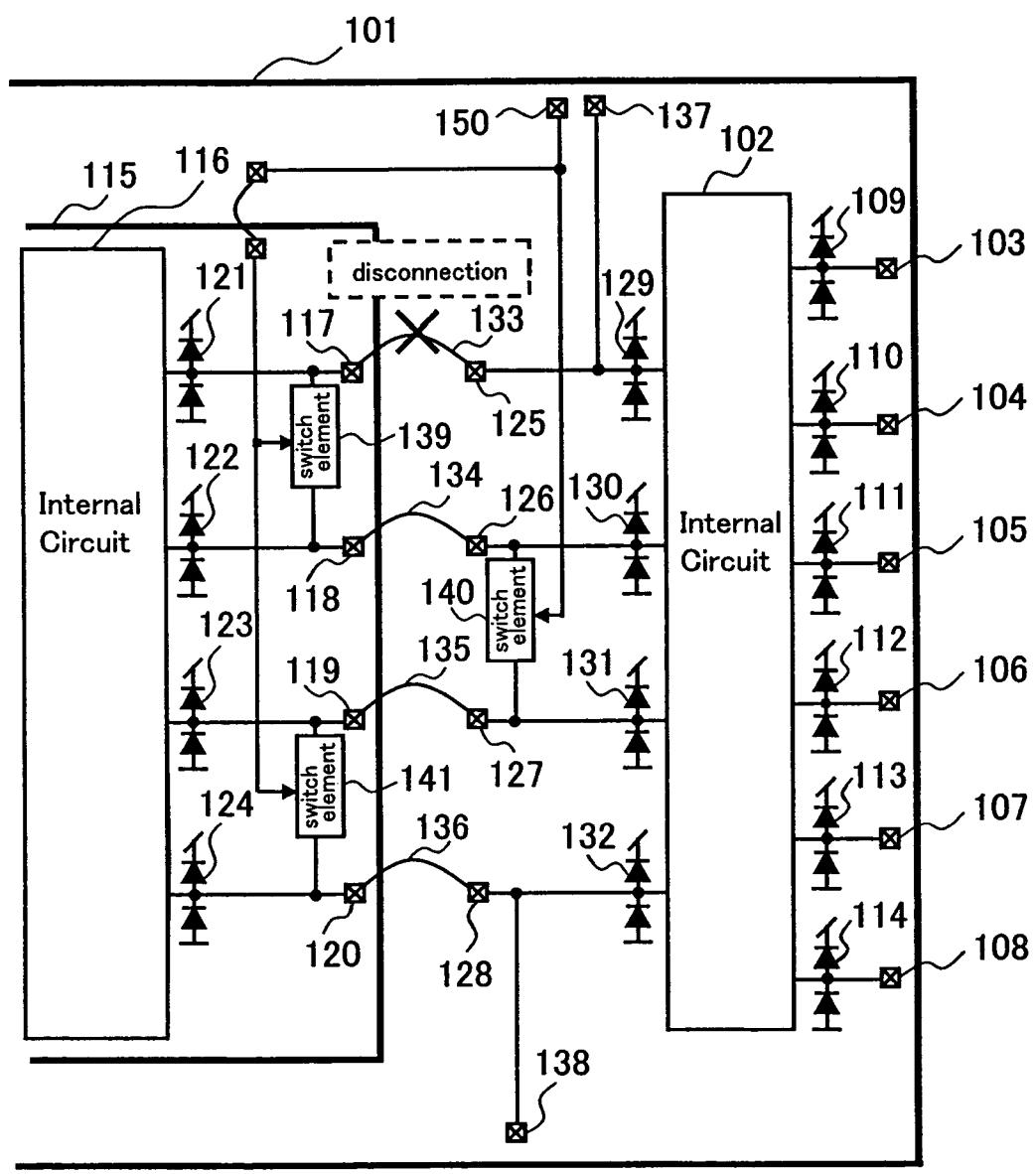
FIG. 4 is a block circuit diagram showing the configuration of a semiconductor apparatus according to an Embodiment 4 of the present invention.

FIG. 4 is a block circuit diagram showing the configuration of a semiconductor apparatus according to an Embodiment 4 of the present invention. In FIG. 4, a numeral 101 denotes a base semiconductor chip (hereinafter referred to as parent chip). A numeral 102 denotes an internal circuit integrated on the parent chip 101. Numerals 103–108 denote terminals for sending and receiving signals between the internal circuit 102 and an external system of the parent chip 101. Numerals 109–114 denote diodes connected to the terminals 103–108. A numeral 115 denotes a semiconductor chip superposed on the parent chip 101 (hereinafter referred to as child chip). A numeral 116 denotes an internal circuit integrated on the child chip 115. Numerals 117–120 denote chip-connecting terminals for sending and receiving signals between the internal circuit 116 and the internal circuit 102 on the parent chip 101. Numerals 121–124 denote diodes connected to the chip-connecting terminals 117–120. Numerals 125–128 denote chip-connecting terminals for sending and receiving signals between the internal circuit 102 on the parent chip 101 and the internal circuit 116 on the child chip 115. Numerals 129–132 denote diodes connected to the chip-connecting terminals 125–128. Numerals 133–136 denote wires connecting the chip-connecting terminals 117–120 and 125–128. Numerals 137 and 138 denote terminals for a conduction test. A numeral 150 denotes a switch control terminal, which is used to run a conduction test collectively to the wires 133–136. A numeral 139 denotes a switch element serially connected between the chip-connecting terminals 117 and 118, a numeral 140 denotes a switch element serially connected between the chip-connecting terminals 126 and 127, and a numeral 141 denotes a switch element serially connected between the chip-connecting terminals 119 and 120. These switch elements 119 and 120 are conducted when a power-supply potential (VDD) is applied to the conduction-test terminal 137 and non-conducted when a ground potential (VSS) is applied thereto.

The action of the semiconductor apparatus of this embodiment configured in the foregoing manner is hereinafter described. When the power-supply potential (VDD) is applied to the conduction-test terminal 137 and the switch control terminal 150 and the ground potential (VSS) is applied to the conduction-test terminal 138, the switch elements 139–141 are conducted. When the wires 133–136 are in normal state with no malfunction, a current flows between the conduction-test terminals 137 and 138. When any of the wires connecting the respective chip-connecting terminals between the parent and child chips undergoes a disconnection, there is no current flow between the terminals. Therefore, the wires connecting the plural chip-connecting terminals can be collectively examined for the detection of disconnections in one measurement.

Embodiment 5

Figure 5:
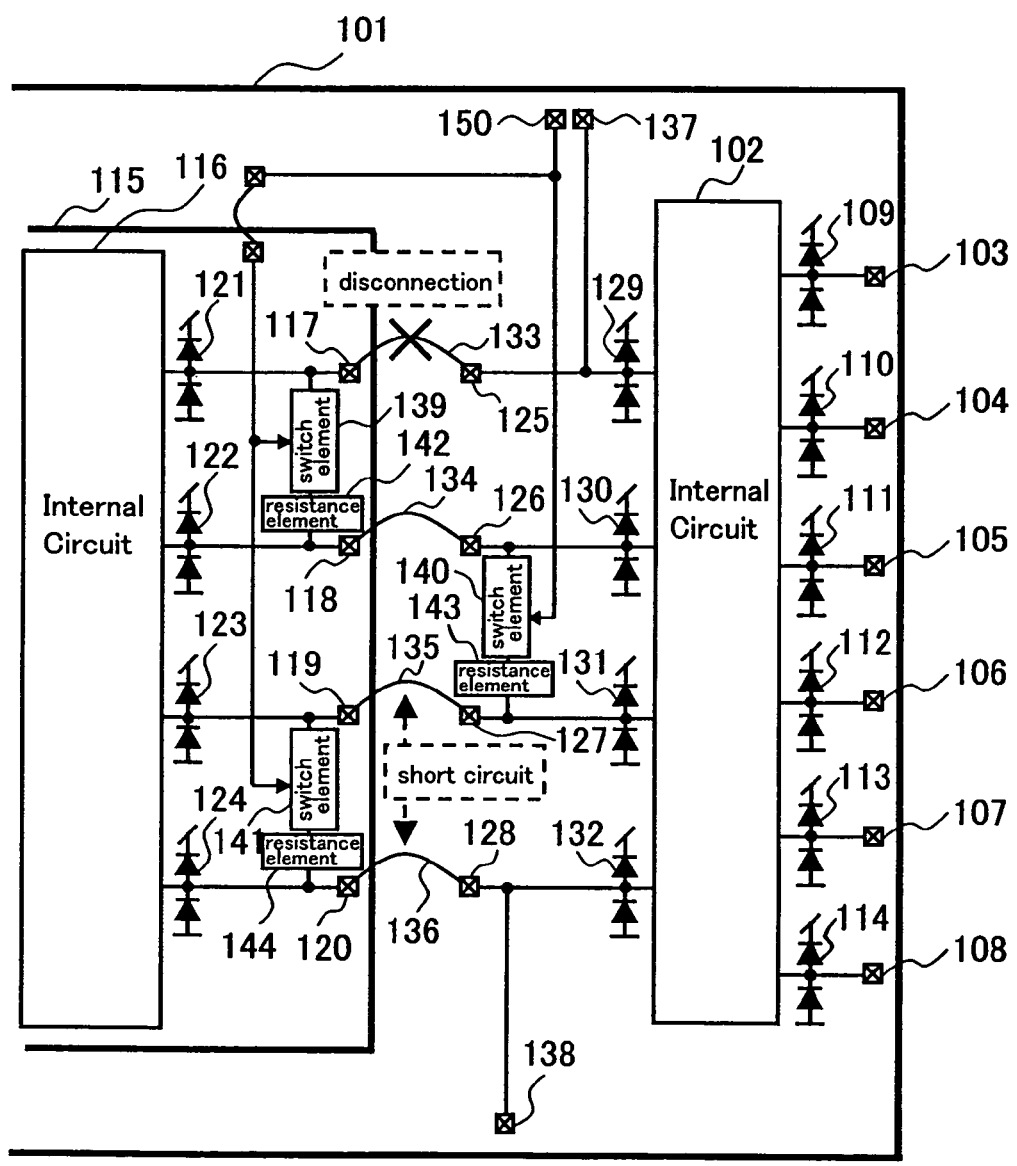
FIG. 5 is a block circuit diagram showing the configuration of a semiconductor apparatus according to an Embodiment 5 of the present invention.

FIG. 5 is a block circuit diagram showing the configuration of a semiconductor apparatus according to an Embodiment 5 of the present invention. In FIG. 5, the reference numerals shown therein identical to those in FIG. 4 of the Embodiment 4 refer to the same components. Therefore, the detailed descriptions thereof are omitted. The Embodiment 5 differs from the Embodiment 4 in a resistance element 142 serially connected to a switch element 139 between chip-connecting terminals 117 and 118, a resistance element 143 serially connected to a switch element 140 between chip-connecting terminals 126 and 127, and a resistance element 144 serially connected to a switch element 141 between chip-connecting terminals 119 and 120.

The action of the semiconductor apparatus of this embodiment configured in the foregoing manner is hereinafter described. The basic action is the same as described in the Embodiment 4. When a power-supply potential (VDD) is applied to a conduction-test terminal 137 and a switch control terminal 150 and a ground potential (VSS) is applied to a conduction-test terminal 138, switch elements 139–141 are conducted. When the wires 133–136 are in normal state with no malfunction, a current flowing between the conduction-test terminals 137 and 138 is:

[VDD−VSS/Total resistance value of resistance elements 142–144]

However, when any of the wires connecting the respective chip-connecting terminals between the parent and child chips undergoes a disconnection, there is no current flow between the terminals. Therefore, the wires connecting the plural chip-connecting terminals can be collectively examined for the detection of disconnections in one measurement.

When a short circuit occurs between the adjacent chip-connecting terminals, the resistance element connected to both ends of the short-circuited terminals is circumvented resulting in measuring an increased current value. Thus, the adjacent chip-connecting terminals can be collectively examined for the detection of short circuits according to a difference in the current values in one measurement.

As described, according to this embodiment, in addition to that the wires connecting the chip-connecting terminals can be collectively examined for the detection of disconnections, the chip-connecting terminals can be collectively examined for the detection of short circuits by confirming the difference in the current values.

Embodiment 6

FIG. 6 is a block circuit diagram showing the configuration of a semiconductor apparatus according to an Embodiment 6 of the present invention. In FIG. 6, the reference numerals shown therein identical to those in FIG. 5 of the Embodiment 5 refer to the same components. Therefore, the detailed descriptions thereof are omitted. The Embodiment 6 differs from the Embodiment 5 in resistance elements 142a–144a, resistance values of which are weighted twice relative to one another.

The action of the semiconductor apparatus of this embodiment configured in the foregoing manner is hereinafter described. The basic action is the same as described in the Embodiment 5. In one measurement, wires connecting a plurality of chip-connecting terminals can be collectively examined for the detection of disconnections and adjacent chip-connecting terminals can be collectively examined for the detection of short circuits. Furthermore, because the resistance values of the resistance elements 142a–144a twice differ relative to one another, a measured current value shows a unique certain value depending on where the short circuit occurs. This enables the occurrence of a short circuit between the chip-connecting terminals to be located.

The resistance values of the plural resistance elements are not necessarily weighted twice relative one another. The weighting may done, supposing that k is an optional real number, k times. It is even unnecessary for the weighting to be so orderly as multiplying, for example, k times relative to one another. The resistance values of the plural resistance elements are only required to be different to one another.

Embodiment 7

Figure 7:
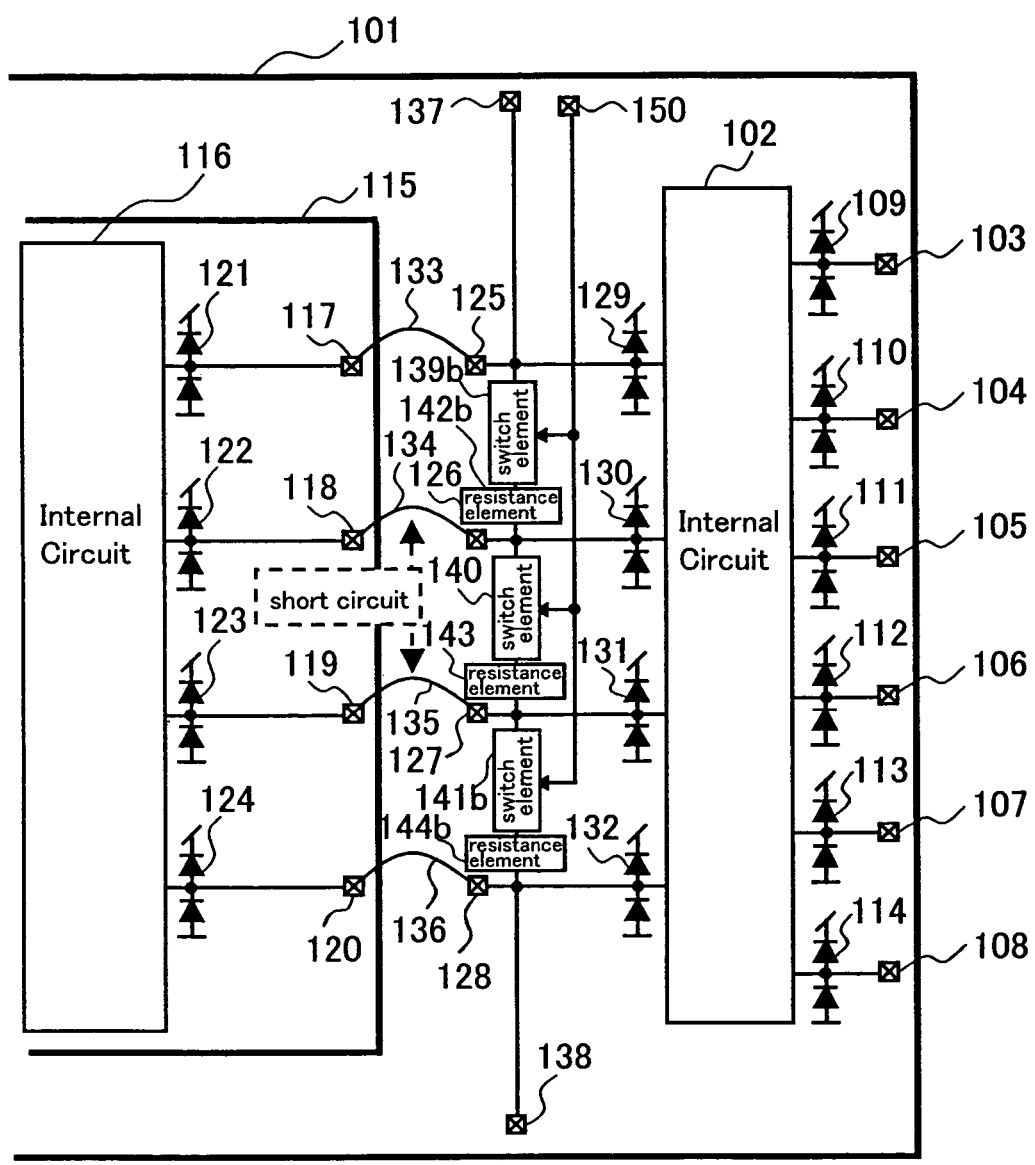
FIG. 7 is a block circuit diagram showing the configuration of a semiconductor apparatus according to an Embodiment 7 of the present invention.

FIG. 7 is a block circuit diagram showing the configuration of a semiconductor apparatus according to an Embodiment 7 of the present invention. In FIG. 7, the reference numerals shown therein identical to those in FIG. 5 of the Embodiment 5 refer to the same components. Therefore, the detailed descriptions thereof are omitted. The Embodiment 7 differs from the Embodiment 5 in switch elements 139b and 141b and resistance elements 142b and 144b. A serially-connected body comprised of the switch element 139b and the resistance element 142b and a serially-connected body comprised of the switch element 141b and the resistance element 144b respectively corresponds to the serially-connected body comprised of the switch element 139 and the resistance element 142 and the serially-connected body comprised of the switch element 141 and the resistance element 144 shown in FIG. 5 transferred from the child chip 115 to the parent chip 101.

The action of the semiconductor apparatus of this embodiment configured in the foregoing manner is hereinafter described. When a power-supply potential (VDD) is applied to a conduction-test terminal 137 and a switch control terminal 150 and a ground potential (VSS) is applied to a conduction-test terminal 138, switch elements 139b, 140 and 141b are conducted.

When wires 133–136 are in normal state with no malfunction, a current flowing between the conduction-test terminals 137 and 138 is:

[VDD–VSS/Total resistance value of resistance elements 142b, 143, 144b]

However, when a short circuit occurs between the adjacent chip-connecting terminals, the resistance element connected to both ends of the short-circuited terminals is circumvented resulting in measuring an increased current value. A difference in the current values enables the adjacent chip-connecting terminals to be collectively examined for the detection of short circuits in one measurement.

Further, having the included components integrated on the parent chip 101 side, it is totally unnecessary to change the design, for example, adding switch and resistance elements for the conduction test to the child chip 115. Accordingly, a semiconductor chip manufactured by other companies can be used for the child chip 115.

Embodiment 8

Figure 8:
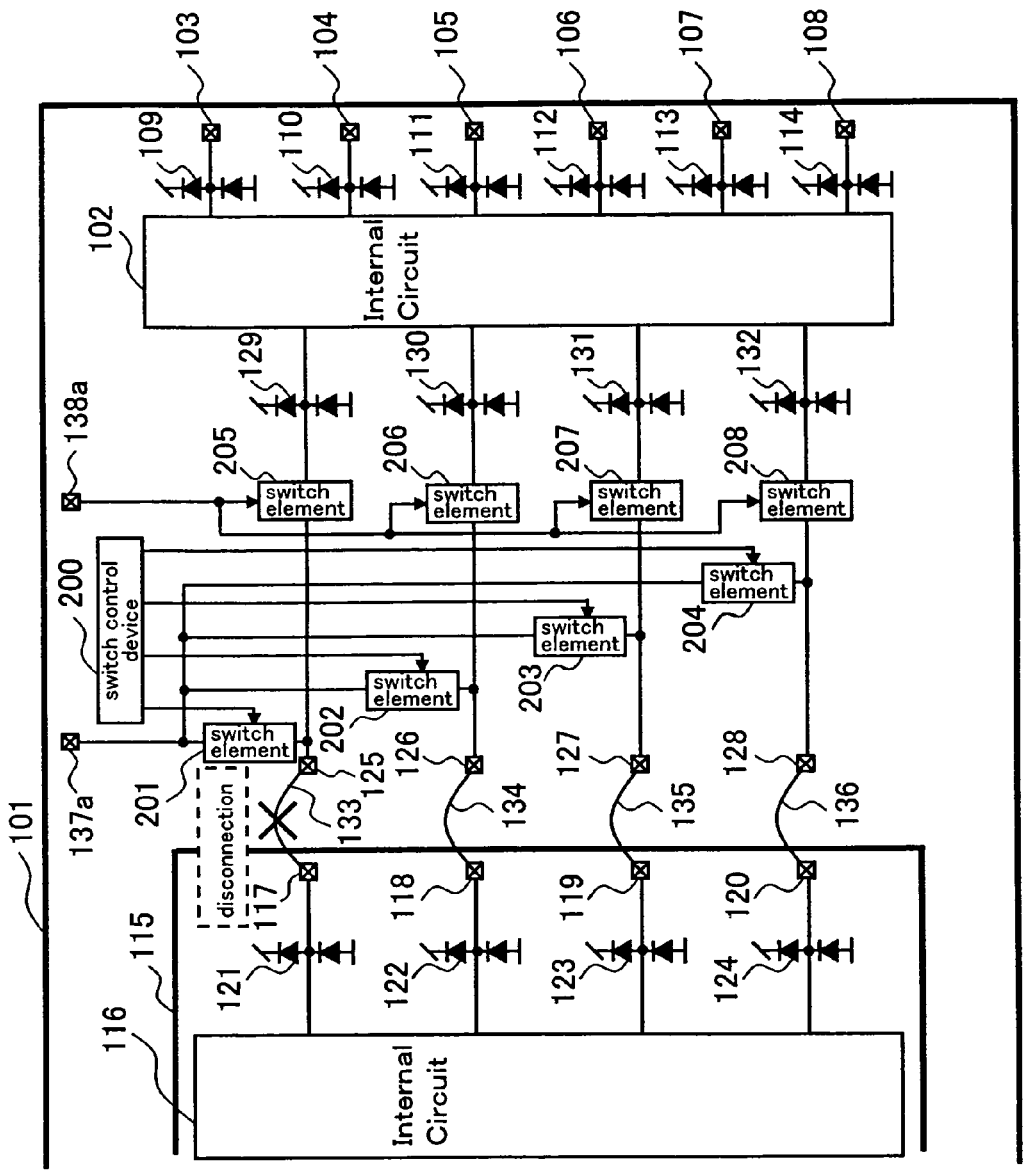
FIG. 8 is a block circuit diagram showing the configuration of a semiconductor apparatus according to an Embodiment 8 of the present invention.

FIG. 8 is a block circuit diagram showing the configuration of a semiconductor apparatus according to an Embodiment 8 of the present invention. In FIG. 8, the reference numerals shown therein identical to those in FIG. 4 of the Embodiment 4 refer to the same components. Therefore, the detailed descriptions thereof are omitted. The Embodiment 8 differs from the Embodiment 4 in a switch control device 200, switch elements 201–204, line switch elements 205–208 and terminals for a conduction test 137a and 138a. The switch elements 201–204 are respectively serially connected between chip-connecting terminals 125–128 and the conduction-test terminal 137a. The switch control device 200 controls so as to conduct each of the switch elements 201–204 at a time in the conduction test. The line switch elements 205–208 are respectively serially connected between the chip-connecting terminals 125–128 and diodes 129–132.

The action of the semiconductor apparatus of this embodiment configured in the foregoing manner is hereinafter described. The line switch elements 205–208 are previously arranged to be non-conducted by controlling the conduction-test terminal 138a to thereby block the current path to the diodes 129–132. When a wire 133 is a conduction-test object, the switch control device 200 controls to have only the switch element 201 conducted leaving the switch elements 201–204 non-conducted. Then, a potential exceeding (power-supply potential (VDD)+threshold voltage Vt of diode 121) is applied to the conduction-test terminal 137a, and the current flowing at the conduction-test terminal 137a is measured at the same time. When the wire 133 is in normal state with no malfunction, the current flows at the diode 121 in the forward direction with respect to the power-supply potential (VDD), which determines that the wire 133 is conducted. On the contrary, when the current value is zero, it is detected that the wire 133 undergoes a disconnection.

Performing the described measurement sequentially to each of the chip-connecting terminals 125–128, the presence or absence of any disconnection in all the wires 133–136 is detected. Moreover, having the included components integrated on the parent chip 101 side, it is totally unnecessary to change the design, for example, adding switch and resistance elements for the conduction test to the child chip 115. Accordingly, a semiconductor chip manufactured by other companies can be used for the child chip 115.

Embodiment 9

Figure 9:
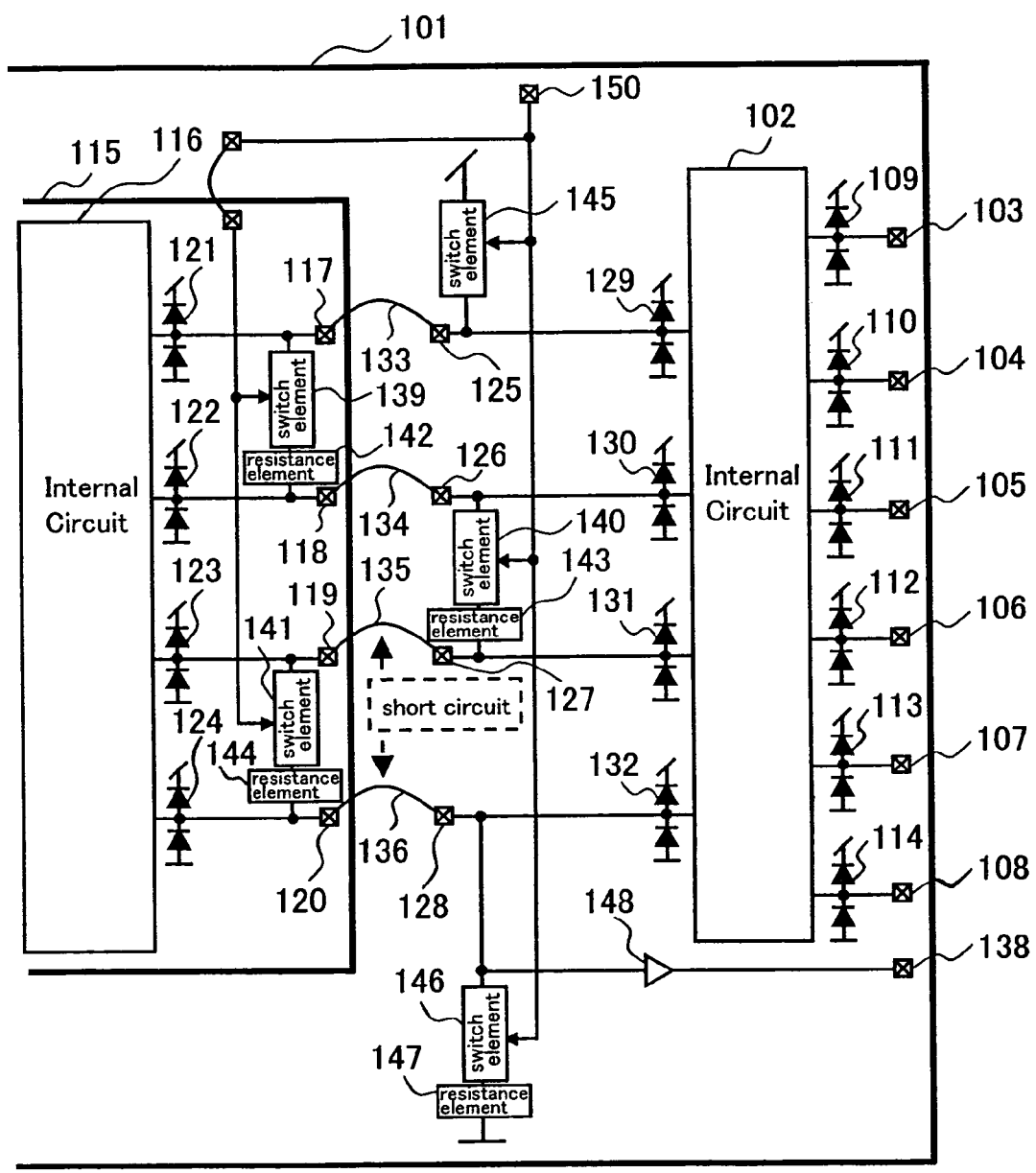
FIG. 9 is a block circuit diagram showing the configuration of a semiconductor apparatus according to an Embodiment 9 of the present invention.

FIG. 9 is a block circuit diagram showing the configuration of a semiconductor apparatus according to an Embodiment 9 of the present invention. In FIG. 9, the reference numerals shown therein identical to those in FIG. 4 of the Embodiment 4 refer to the same components. Therefore, the detailed descriptions thereof are omitted. The Embodiment 9 differs from the Embodiment 4 in a switch element 145 on a power-supply potential side, a switch element 146 on a ground potential side, a resistance element for dividing voltage 147 and a logic element 148. The switch element 145 on the power-supply potential side is connected between a chip-connecting terminal 125 and the power-supply potential (VDD). A serially-connected body comprised of the switch element 146 on the ground potential side and the voltage-dividing resistance element 147 is connected between a chip-connecting terminal 128 and the ground potential (VSS). The switch element 145 on the power-supply potential side and the switch element 146 on the ground potential side are, as in the same manner as switch elements 139–141, conducted when the power-supply potential (VDD) is applied to a switch control terminal 150 and non-conducted when the ground potential is applied thereto. The logic element 148 is interposed between a terminal for a conduction test 138 and the switch element 146 on the ground potential side. A potential, which is voltage-divided by a total resistance value of the resistance elements 142–144 serially connected between an input portion of the logic element 148 and the power-supply potential (VDD) and a resistance value of the voltage-dividing resistance element 147 serially connected between the input portion of the logic element 148 and the ground potential (VSS), is set to be lower than an input threshold level of the logic element 148.

The action of the semiconductor apparatus of this embodiment configured in the foregoing manner is hereinafter described. The basic action is the same as described in the Embodiment 4. When the power-supply potential (VDD) is applied to the switch control terminal 150, the switch elements 139–141, 145 and 146 are conducted. In this case, when wires 133–136 are in normal state with no malfunction, the voltage-divided potential is lower than the threshold value of the logic element 148. Therefore, the logic element 148 outputs a predetermined value. On the contrary, when a short circuit occurs between the wires 135–136, the resistance element 144 connected between chip-connecting terminals 119 and 120 is circumvented, the voltage-divided potential is higher than the threshold value of the logic element 148. Accordingly, the logic element 148 outputs a value reverse to the same in normal state. Therefore, the plural chip-connecting terminals can be collectively examined for the detection of short circuits in one measurement according to the output value of the logic element 148. Moreover, the detection is done according to the reversed output value of the logic element, which eliminates the need to provide a relatively expensive test device capable of measuring a current at the time of applying a voltage. The test device can be thus simplified.

Embodiment 10

Figure 10:
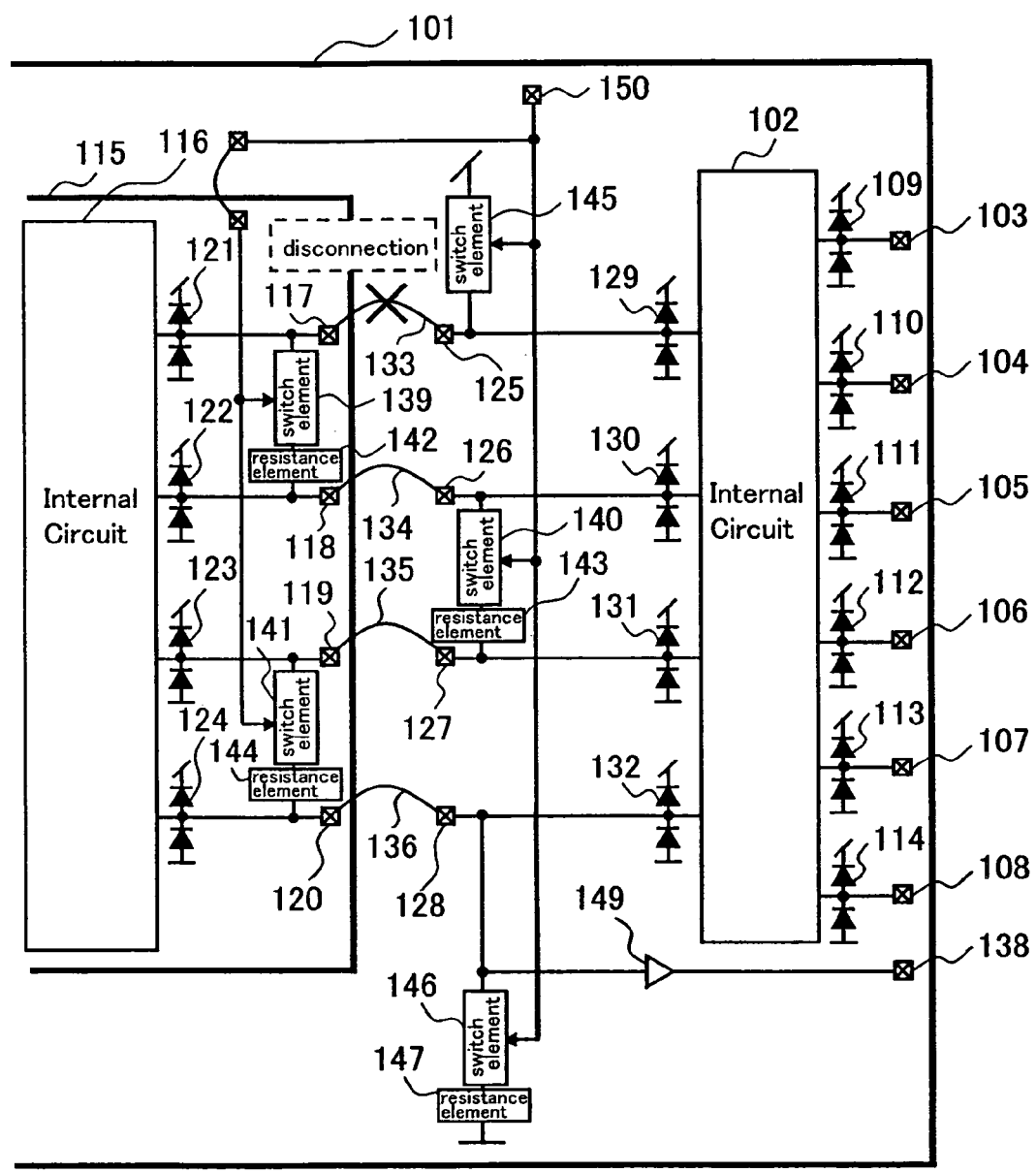
FIG. 10 is a block circuit diagram showing the configuration of a semiconductor apparatus according to an Embodiment 10 of the present invention.
Figure 13:
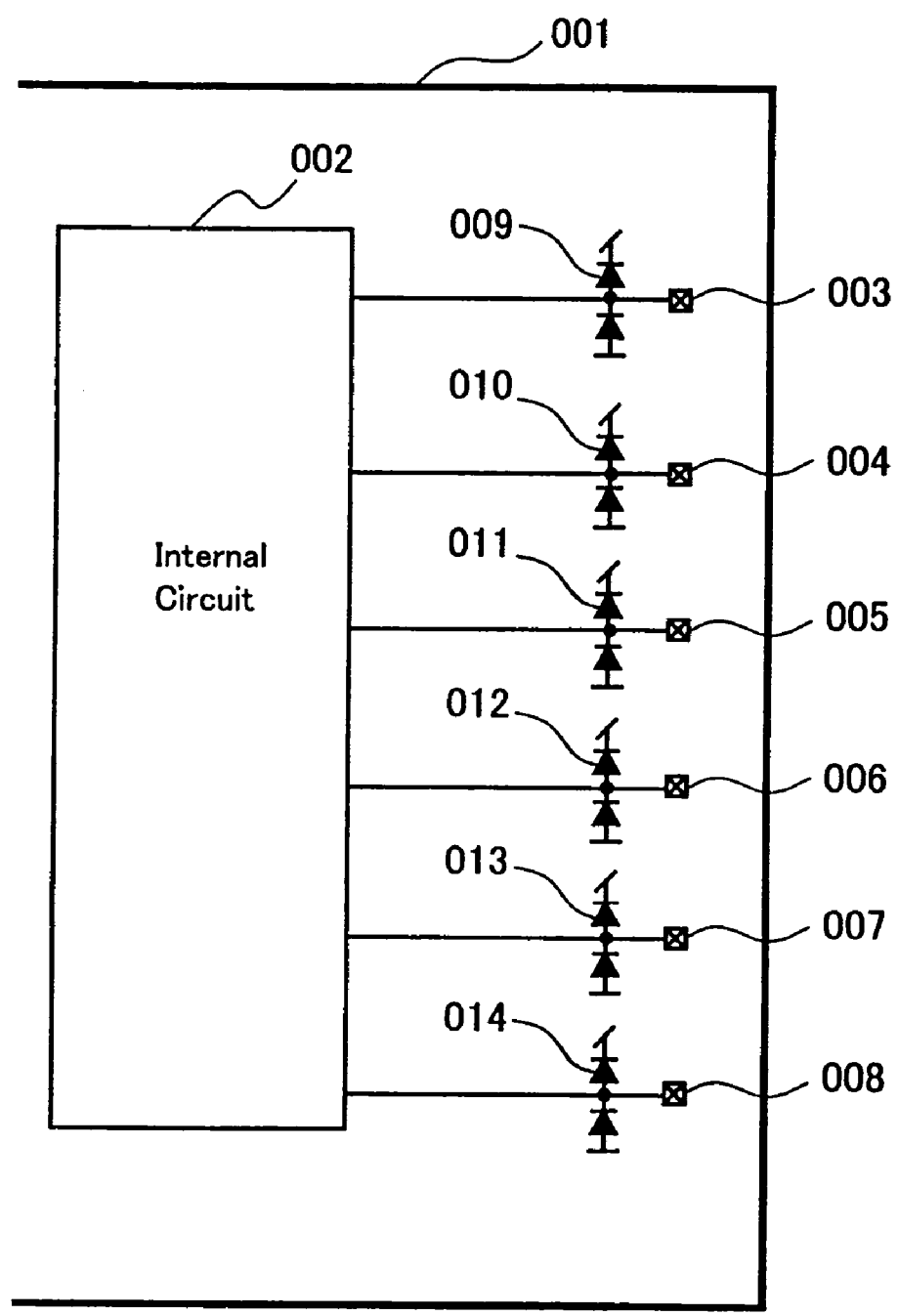
FIG. 13 is a block circuit diagram showing the configuration of a conventional semiconductor apparatus.
Figure 14:
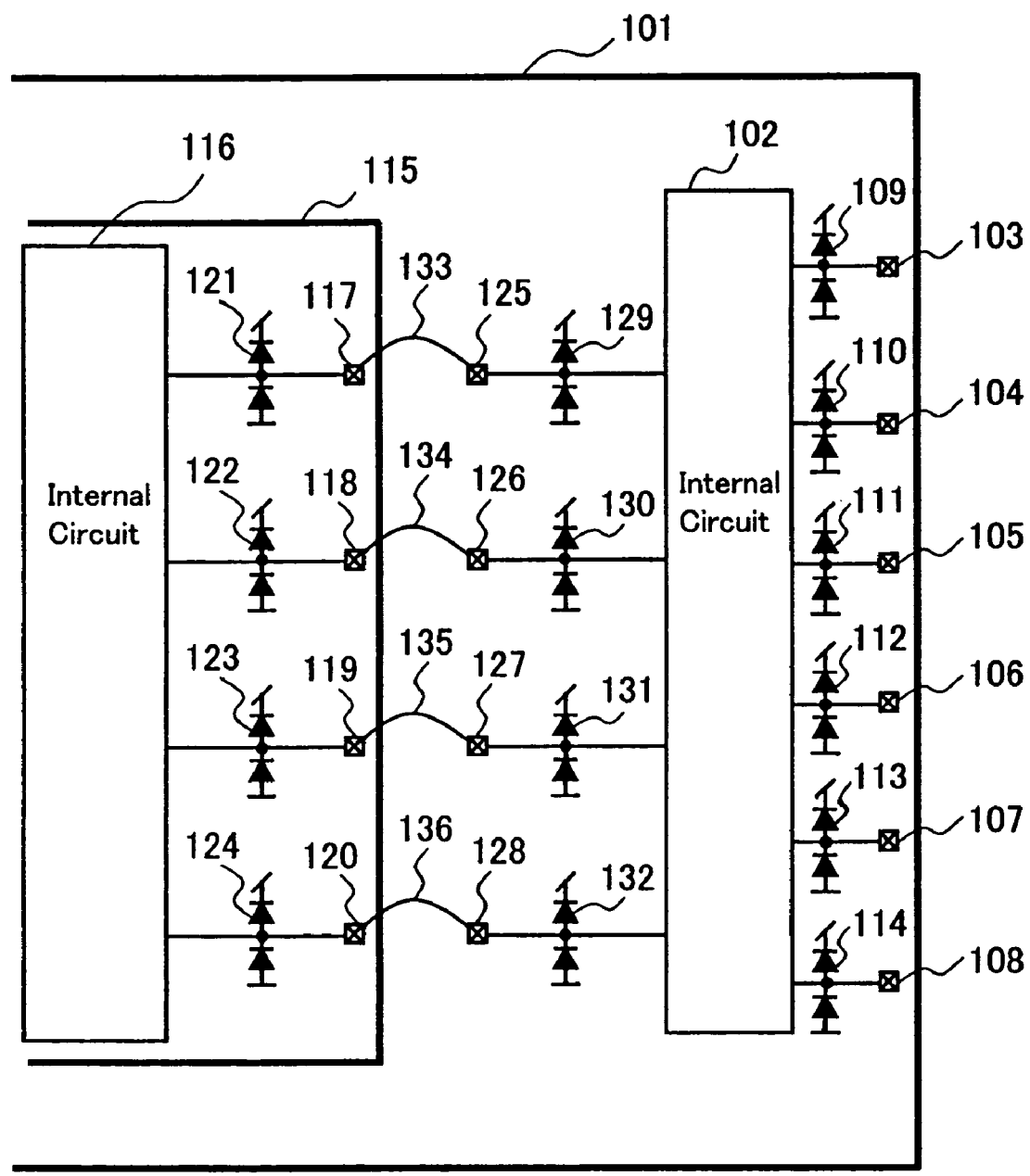
FIG. 14 is a block circuit diagram showing the configuration of another conventional semiconductor apparatus.

FIG. 10 is a block circuit diagram showing the configuration of a semiconductor apparatus according to an Embodiment 10 of the present invention. In FIG. 10, the reference numerals shown therein identical to those in FIG. 9 of the Embodiment 9 refer to the same components. Therefore, the detailed descriptions thereof are omitted. The Embodiment 10 differs from the Embodiment 9 in a logic element 149. A potential, which is voltage-divided by a total resistance value of resistance elements 142–144 serially connected between an input portion of the logic element 149 and a power-supply potential (VDD) and a resistance value of a voltage-dividing resistance element 147 serially connected between the input portion of the logic element 149 and a ground potential (VSS), is set to be higher than an input threshold level of the logic element 149. The logic in the action of the logic element 149 is contrary to that of the logic element 148 in the Embodiment 9.

The action of the semiconductor apparatus of this embodiment configured in the foregoing manner is hereinafter described. The basic action is the same as described in the Embodiment 1. When a-power-supply potential (VDD) is applied to a switch control terminal 150, switch elements 139–141, 145 and 146 are conducted. In this case, when wires 133–136 are in normal state with no malfunction, the voltage-divided potential is higher than the threshold value of the logic element 149. Therefore, the logic element 149 outputs a predetermined value. On the contrary, when any of the wires 133–136 undergoes a disconnection, the voltage-divided potential is lower than the threshold value of the logic element 149. Accordingly, the logic element 149 outputs a value reverse to the same in normal state. Therefore, the wires connecting the plural chip-connecting terminals can be collectively examined for the detection of disconnections in one measurement according to the output value of the logic element 149. Moreover, the detection is done according to the reversed output value of the logic element, which eliminates the need to provide a relatively expensive test device capable of measuring a current at the time of applying a voltage. The test device can be thus simplified. The difference between the Embodiment 9 and this embodiment is that the Embodiment 9 offers the detection of short circuits, while this embodiment offers the detection of disconnections.

Embodiment 11

FIG. 11 is a block circuit diagram showing the configuration of a semiconductor apparatus according to an Embodiment 11 of the present invention. The Embodiment 11 corresponds to the combination of the Embodiments 9 and 10. In FIG. 11, the reference numerals shown therein refer to the same components identical to those in FIGS. 9 and 10 of the Embodiments 9 and 10. Therefore, the detailed descriptions thereof are omitted. This embodiment includes a first logic element 148a in the same manner as the logic element 148 in FIG. 9 and a logic element 149a in the same manner as the logic element 149 in FIG. 10. In this configuration, both short circuits and disconnections can be detected.

Embodiment 12

FIG. 12 is a block circuit diagram showing the configuration of a semiconductor apparatus according to an Embodiment 12 of the present invention. In FIG. 12, the reference numerals shown therein identical to those in FIG. 9 of the Embodiment 9 refer to the same components. Therefore, the detailed descriptions thereof are omitted. The Embodiment 12 differs from the Embodiment 9 in switch elements 139b and 141b and resistance elements 142b and 144b. A serially-connected body comprised of the switch element 139b and the resistance element 142b and a serially-connected body comprised of the switch element 141*b* and the resistance element 144*b* respectively correspond to the serially-connected body comprised of the switch element 139 and the resistance element 142 and the serially-connected body comprised of the switch element 141 and the resistance element 144, which are shown in FIG. 9, transferred from the child chip 115 to the parent chip 101.

The action of the semiconductor apparatus of this embodiment configured in the foregoing manner is hereinafter described. The basic action is the same as described in the Embodiment 9. When a power-supply potential (VDD) is applied to a switch control terminal 150, the switch elements 139*b*, 140, 141*b*, 145 and 146 are conducted. In this case, when wires 133–136 are in normal state with no malfunction, the voltage-divided potential is lower than the threshold value of the logic element 148. Therefore, the logic element 148 outputs a predetermined value. On the contrary, when a short circuit occurs between the wires 134–135, the resistance element 143 connected between chip-connecting terminals 126 and 127 is circumvented, the voltage-divided potential is higher than the threshold value of the logic element 148. Accordingly, the logic element 148 outputs a value reverse to the same in normal state. Therefore, the plural chip-connecting terminals can be collectively examined for the detection of short circuits in one measurement according to the output value of the logic element 148. Moreover, the detection is done according to the reversed output value of the logic element, which eliminates the need to provide a relatively expensive test device capable of measuring a current at the time of applying a voltage. The test device can be thus simplified.

In addition to the foregoing, having the included components integrated on the parent chip 101 side, it is totally unnecessary to change the design, for example, adding switch elements and resistance elements for the conduction test to the child chip 115. Accordingly, a semiconductor chip manufactured by other companies can be used for the child chip 115.

In the embodiments thus far described, a switch element or a pair of switch and resistance elements can be easily formed from N-type or P-type transistors, or N-type and P-type MOS transistors.

From the above description, it will be apparent what the present invention provides.

What is claimed is:

1. A semiconductor apparatus comprising:

a plurality of nodes;

a plurality of bodies are connected in series and respectively interposed between the plurality of nodes, each body having a switch element and a resistance element which are connected in series;

a plurality of test terminals for a conduction test respectively connected to one and another ends of the plurality of bodies; and a switch control terminal for a collective control connected to all the plurality of switch elements.

2. A semiconductor apparatus as claimed in claim 1, wherein each resistance value of the plurality of resistance elements in the plurality of bodies is weighted.

3. A semiconductor apparatus as claimed in claim 1 wherein the switch elements are formed from N-type or P-type MOS transistors, or N-type and P-type MOS transistors.

4. A semiconductor apparatus as claimed in claim 1 wherein the resistance elements are formed from N-type or P-type transistors, or N-type and P-type MOS transistors.

* * * * *